United States Patent
Katou et al.

(10) Patent No.: US 10,365,506 B2
(45) Date of Patent: Jul. 30, 2019

(54) OPTICAL MODULATOR

(71) Applicant: Sumitomo Osaka Cement Co., Ltd, Tokyo (JP)

(72) Inventors: Kei Katou, Tokyo (JP); Toshio Kataoka, Tokyo (JP); Junichiro Ichikawa, Tokyo (JP)

(73) Assignee: SUMITOMO OSAKA CEMENT CO., LTD, Tokyo (JP)

( * ) Notice: Subject to any disclaimer, the term of this patent is extended or adjusted under 35 U.S.C. 154(b) by 0 days.

(21) Appl. No.: 15/755,735

(22) PCT Filed: Sep. 27, 2016

(86) PCT No.: PCT/JP2016/078429
§ 371 (c)(1),
(2) Date: Feb. 27, 2018

(87) PCT Pub. No.: WO2017/057351
PCT Pub. Date: Apr. 6, 2017

(65) Prior Publication Data
US 2019/0025612 A1    Jan. 24, 2019

(30) Foreign Application Priority Data
Sep. 30, 2015  (JP) ................. 2015-192597

(51) Int. Cl.
*G02F 1/01* (2006.01)
*H05K 1/02* (2006.01)
(Continued)

(52) U.S. Cl.
CPC ............. *G02F 1/0102* (2013.01); *G02F 1/01* (2013.01); *H05K 1/028* (2013.01); *H05K 1/0216* (2013.01);
(Continued)

(58) Field of Classification Search
CPC ....... G02F 1/0102; G02F 1/01; H05K 1/0216; H05K 1/028; H05K 2201/052; H05K 1/119; H05K 1/147
See application file for complete search history.

(56) References Cited

U.S. PATENT DOCUMENTS

2011/0221649 A1   9/2011   Price et al.

FOREIGN PATENT DOCUMENTS

| JP | H06188322 A | 7/1994 |
|----|-------------|--------|
| JP | 2010074794 A | 4/2010 |

(Continued)

OTHER PUBLICATIONS

International Search Report for PCT/JP2016/078429 dated Dec. 27, 2016.

*Primary Examiner* — Joseph P Martinez
(74) *Attorney, Agent, or Firm* — Greer, Burns & Crain, Ltd.

(57) ABSTRACT

Provided is an optical modulator in which a phenomenon of a resonance mode or the like is prevented from being generated in a recess portion of a housing that mounts a flexible printed circuit and of which broadband characteristics are improved.
There is provided an optical modulator in which an optical modulation element is mounted inside a housing, in which at least a portion of an electric line is connected to an external circuit board 7 through a flexible printed circuit 6, and which is disposed on the external circuit board. A recess portion (area indicated with a dotted line D) that mounts the flexible printed circuit is formed on an outer bottom surface of the housing and at a part where the flexible printed circuit is connected, and means for preventing a resonance mode or the like (for example, a corrugated shape 21) is provided such that a resonance mode of a microwave and a millimeter wave or a parallel plate mode is prevented from being (Continued)

generated among a surface A of the recess portion facing the flexible printed circuit, an electric wiring part B provided on the flexible printed circuit overlapping the surface A when seen in a plan view, an electric wiring part C provided on the external circuit board overlapping the surface A when seen in a plan view.

5 Claims, 5 Drawing Sheets

(51) Int. Cl.
  *H05K 1/14* (2006.01)
  *H05K 1/11* (2006.01)

(52) U.S. Cl.
  CPC .............. *H05K 1/119* (2013.01); *H05K 1/147* (2013.01); *H05K 2201/052* (2013.01)

(56) References Cited

FOREIGN PATENT DOCUMENTS

| | | | | |
|---|---|---|---|---|
| JP | 2014-179432 | * | 9/2014 | ............. H01L 23/04 |
| JP | 2014165289 A | | 9/2014 | |
| JP | 2014179432 A | | 9/2014 | |
| JP | 2014195061 A | | 10/2014 | |

* cited by examiner

OPTICAL MODULATOR

TECHNICAL FIELD

The present invention relates to an optical modulator, and particularly relates to an optical modulator in which an optical modulation element is mounted inside a housing, that is, an optical modulator in which at least a portion of an electric line is connected to an external circuit board through a flexible printed circuit and which is disposed on the external circuit board.

BACKGROUND ART

In the field of optical communication, transceivers using an optical modulator are utilized. Recently, in accordance with demands for miniaturizing optical transmission systems, RF interface connection of an optical modulator mounted in a transceiver module (transponder) also tends to be shortened.

Figure 1:
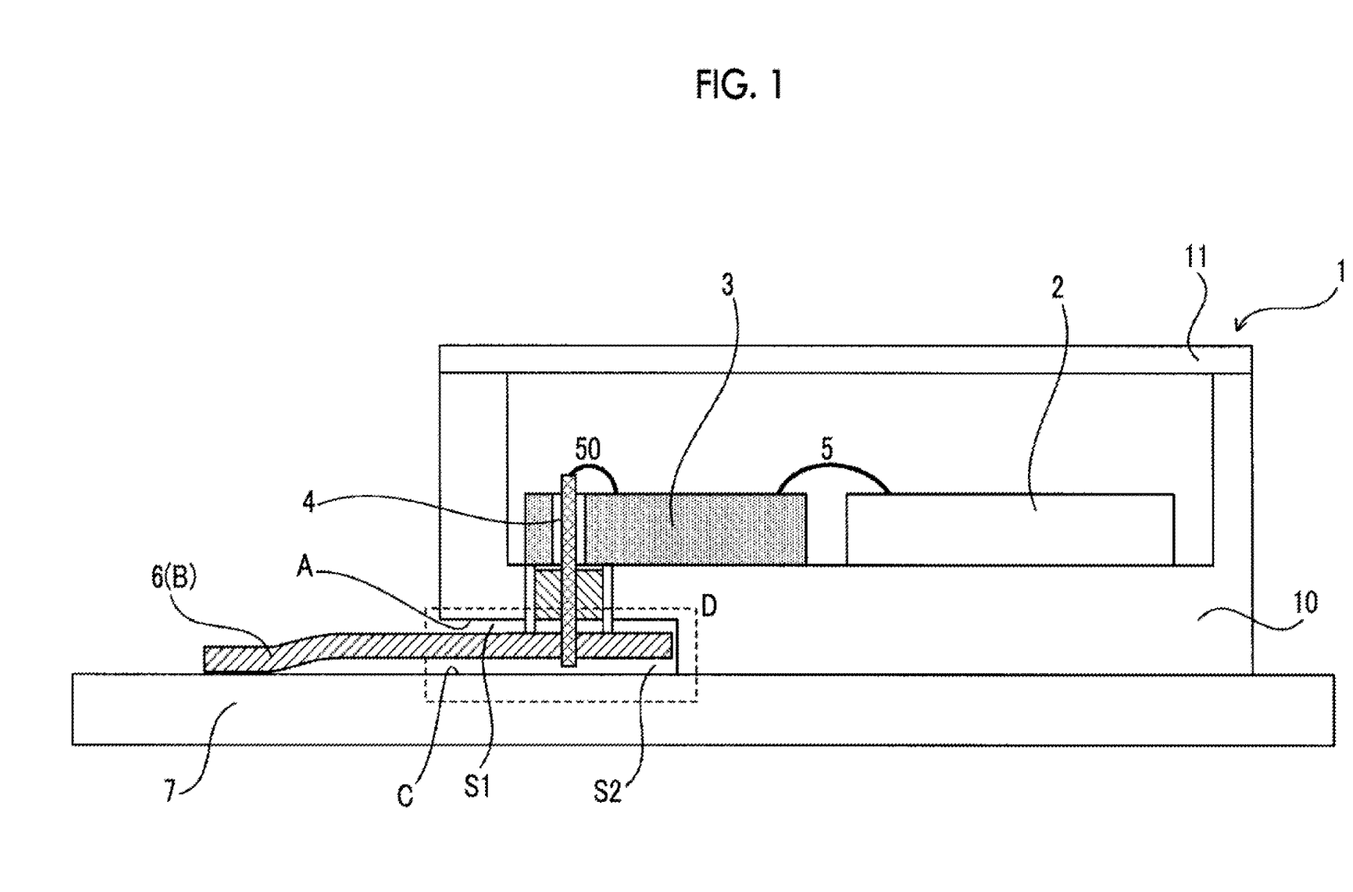
FIG. 1 is a cross-sectional view illustrating an example of an optical modulator including an FPC.

FIG. 1 illustrates a situation where an optical modulator is disposed on an external circuit board 7 configuring a module. As means for realizing shortened connection, as illustrated in FIG. 1, an interface employing a surface mount technology (SMT) using a flexible printed circuit (FPC) 6 and a lead pin 4 has been utilized, progressing from cable connection using a coaxial connector such as a push-on coaxial connector in the related art. Patent Literature No. 1 discloses an optical modulator using a flexible printed circuit.

FIG. 1 illustrates a cross-sectional view of a state where an optical modulator is disposed on an external circuit board. An optical modulator 1 mounts an optical modulation element 2 inside a housing 10 and is hermetically sealed. The reference sign 11 indicates a lid part of the housing. The optical modulation element 2 mounted inside the housing, and the external circuit board 7 are electrically connected to each other through the flexible printed circuit 6 and the lead pin 4 which is disposed in a through-hole (connecting a top surface and a bottom surface of the metal housing in a perpendicular direction) of the housing. In addition, the flexible printed circuit 6 and the lead pin 4 are directly connected to each other. The lead pin 4 and the optical modulation element 2 are subjected to wire bonding (50 and 5) using a gold wire or the like through a relay substrate 3.

In the flexible printed circuit 6, a signal line (signal electrode) and a ground line (ground electrode) made of a conductive material such as Au and Cu are formed on one surface or both surfaces of the circuit made of polyimide or the like. A microstrip line having a wide-width ground electrode formed on one surface and a signal electrode on a strip formed on the other surface is in wide use. In signal lines, there are cases where ground electrodes are also disposed in addition to a signal electrode as in a coplanar line such that the signal electrode is interposed therebetween. Although the flexibility of the flexible printed circuit 6 is degraded, a strip line having multiple layers of ground electrode surfaces or a grounded coplanar line is also used.

When the flexible printed circuit 6 is mounted in the optical modulator 1, a recess portion (spot facing portion) is formed on an external bottom surface of the housing as indicated with a dotted line D in FIG. 1, such that the flexible printed circuit 6 does not protrude from the bottom surface of the optical modulator 1.

However, due to the shape of the lead pin 4, it is difficult for both the flexible printed circuit 6 and the bottom surface (surface A facing the FPC 6) forming the recess portion to be brought into completely tight contact and attached to each other. For example, in a case where the signal line and the ground electrode are configured to be coaxially disposed and a tip of the ground electrode part protrudes from a lower surface of the housing, the FPC 6 and the bottom surface A of the recess portion are separated from each other as much as the protruding height of the lead pin 4. Therefore, a gap S1 is generated between both thereof. More specifically, a gap S1 is generated between an electric wiring part B of the signal electrode, the ground electrode, and the like provided on the FPC 6, and the bottom surface A.

In addition, a gap S2 is generated between the FPC 6 and the external circuit board 7. More specifically, a gap S2 is generated between the electric wiring part B of the signal electrode, the ground electrode, and the like provided on the FPC 6, and an electric wiring part C provided on the external circuit board 7. As a reason therefor, in a case where the lead pin 4 is subjected to solder-fixing on the lower surface side of the FPC 6, the tip of the lead pin 4 protrudes from the lower surface of the FPC 6. In order to prevent this protruding lead pin 4 from coming into contact with the external circuit board 7, the depth of the recess portion is intentionally adjusted such that the gap S2 is generated.

Such gaps S1 and S2 are not necessarily air layers. For example, in a case where an insulating protective film is provided on the front surface (or both surfaces) of the FPC 6, or in a case where an insulating protective film is provided on the front surface of the external circuit board, a gap corresponding to the thickness of the protective film (in this case, a state where the gap is filled with the material of the protective film) is inevitably generated.

Figure 2A:
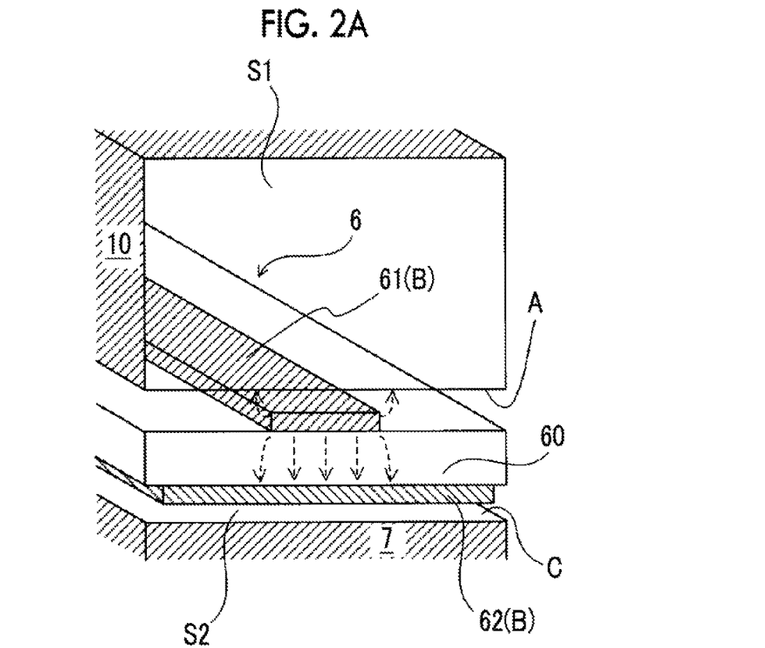
FIG. 2A is a view describing a pseudo-TEM mode.
Figure 2B:
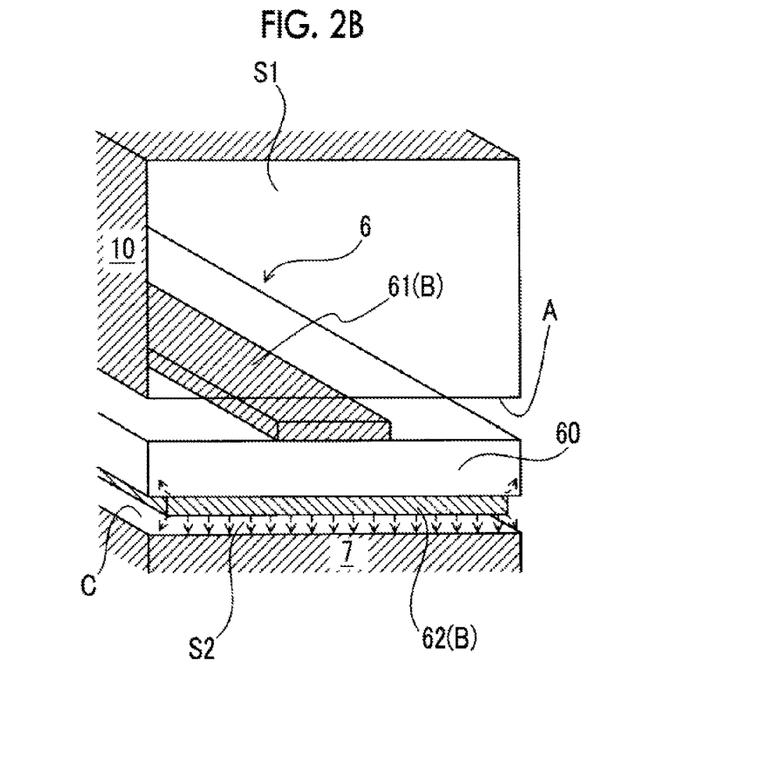
FIG. 2B is a view describing a parallel plate mode.

A case where the gap S1 or S2 is parallel to the ground electrode surface of the FPC 6 leads to generation of a parallel plate mode as described in FIGS. 2A and 2B. FIGS. 2A and 2B illustrate a state where the housing 10 is disposed on the top surface side of the FPC 6 and the external circuit board 7 (conductive surface of the ground electrode and the like) is disposed on the lower surface side. A microstrip line is configured in the FPC 6 such that a signal electrode 61 is disposed on the top surface of a flexible insulating substrate 60 and a ground electrode 62 is disposed on the lower surface respectively.

FIG. 2A schematically illustrates an electric field of a signal in a strip line-type signal line using dotted line arrows. FIG. 2B schematically illustrates a situation where a part of an electric field which has leaked from the signal line causes a parallel plate mode to be generated between the ground electrode surface of the FPC 6 and the external circuit board 7. The dotted line arrows in the diagram indicate the direction of the electric field. A parallel plate mode is also generated between the ground electrode 62 of the FPC 6 (electric line portion B) and the bottom surface A of the recess portion. In any case where the ground electrode 62 is disposed on one side of the external circuit board 7 and the bottom surface A of the recess portion, if the external circuit board 7 and the bottom surface A of the recess portion are parallel to each other, a parallel plate mode is generated. In a case where the ground electrode 62 is narrow in width and the ratio of the opposing area of the external circuit board 7 and the bottom surface A of the recess portion is significant, a parallel plate mode is generated between the external circuit board 7 and the bottom surface A of the recess portion.

As illustrated in FIG. 2A, a pseudo-TEM mode is generated between the signal electrode 61 and the ground electrode 62. As illustrated in FIG. 2B, in the gap S2, a parallel plate mode is generated between the ground electrode 62 and the external circuit board 7. When such a parallel plate mode is generated, broadband characteristics of a modulation signal applied to the optical modulator deteriorate. Besides, the parallel plate mode is characterized by having no cut-off frequency and is generated no matter how the clearance (gap between the ground electrode 62 and the external circuit board 7), that is, the gap S2 is narrowed. Naturally, a parallel plate mode is also generated in the clearance S1 no matter how the clearance between the top surface A of the recess portion (spot facing portion) of the housing 11 and the FPC 6 is narrowed. For example, in a microwave band or a millimeter wave band, even if the distance is narrowed to the extent of 25 μm such that no cavity resonance takes place, a parallel plate mode is generated between the top surface A and the ground electrode 62 or between a ground electrode and the top surface A in a case where the ground electrode is provided on the top surface of the insulating substrate 60 (not illustrated in FIGS. 2A and 2B).

In addition, a cavity resonance mode corresponding to the clearance, that is, the gap S1 or S2 is also generated in the gap S1 or S2 due to a microwave and a millimeter wave emitted to the space, so that a modulation signal in a particular frequency deteriorates (dips). In order to shorten a wiring distance and to ensure easiness of mounting, the gap S1 or S2 is required to be narrower. In this case, a parallel plate mode is likely to be generated.

As in a DP-BPSK optical modulator, a DQPSK optical modulator, a DP-QPSK optical modulator, and the like, in a case of a broadband optical modulator having a plurality of signal lines disposed on the FPC 6, crosstalk caused between the signal lines through a parallel plate mode leads to a severe problem. Since the crosstalk is caused due to power which has leaked from a signal line and is transferred to another signal line through a parallel plate mode having no cut-off frequency, the crosstalk appears throughout an extremely wide frequency.

In a case of a particular frequency, crosstalk can be reduced by means of a stub circuit or a choke circuit. However, the method is not effective in a case of a broadband modulator having a signal band ranging from a MHz band to a millimeter wave band. As alternative means, crosstalk inside a wiring substrate, for example, crosstalk among a plurality of adjacent microstrip lines can be reduced by means in which a via hole is disposed between the lines, a groove is made in a dielectric substrate between the lines, or the like. However, a parallel plate mode is generated between a ground electrode surface and another ground electrode surface of the wiring substrate regardless of whether a via hole, a groove, or the like is formed inside the substrate. In addition, power which has leaked from a signal line reaches not only an adjacent signal line but also other signal lines, thereby resulting in crosstalk. The same applies not only to a microstrip line but also to a line having a different shape.

In the present invention, a phenomenon of a cavity resonance mode of a microwave and a millimeter wave, a parallel plate mode, or the like is expressed as "a resonance mode or the like".

CITATION LIST

Patent Literature

[Patent Literature No. 1] Japanese Laid-open Patent Publication No. 2014-165289

SUMMARY OF INVENTION

Technical Problem

In order to solve the problems described above, the present invention aims to provide an optical modulator in which a phenomenon of a resonance mode or the like is prevented from being generated in a recess portion of a housing that mounts a flexible printed circuit and of which broadband characteristics are improved.

Solution to Problem

In order to solve the problems, an optical modulator of the present invention has the following technical features.

(1) There is provided an optical modulator in which an optical modulation element is mounted inside a housing, in which at least a portion of an electric line is connected to an external circuit board through a flexible printed circuit, and which is disposed on the external circuit board. A recess portion that mounts the flexible printed circuit is formed on an outer bottom surface of the housing and at a part where the flexible printed circuit is connected, and means for preventing a resonance mode or the like is provided such that a resonance mode of a microwave and a millimeter wave or a parallel plate mode is prevented from being generated among a surface A of the recess portion facing the flexible printed circuit, an electric wiring part B provided on the flexible printed circuit overlapping the surface A when seen in a plan view, and an electric wiring part C provided on the external circuit board overlapping the surface A when seen in a plan view.

(2) In the optical modulator according to (1), in the means for preventing a resonance mode or the like, at least one of a clearance or a dielectric constant between the surface A and the electric wiring part B, and a clearance or a dielectric constant between the electric wiring part B and the electric wiring part C is set to be locally varied.

(3) In the optical modulator according to (1), in the means for preventing a resonance mode or the like, at least any one of a pillar electrically connecting the surface A and the electric wiring part with each other or a pillar electrically connecting the electric wiring part B and the electric wiring part with each other is provided.

(4) In the optical modulator according to any one of (1) to (3), electric wirings are respectively formed on both surfaces of the flexible printed circuit, and a via hole electrically connecting ground wirings on both the surfaces with each other is formed.

Advantageous Effects of Invention

According to the present invention, there is provided an optical modulator in which an optical modulation element is mounted inside a housing, in which at least a portion of an electric line is connected to an external circuit board through a flexible printed circuit, and which is disposed on the external circuit board. A recess portion that mounts the flexible printed circuit is formed on an outer bottom surface of the housing and at a part where the flexible printed circuit is connected, and means for preventing a resonance mode or the like is provided such that a resonance mode of a microwave and a millimeter wave or a parallel plate mode is prevented from being generated among a surface A of the recess portion facing the flexible printed circuit, an electric wiring part B provided on the flexible printed circuit overlapping the surface A when seen in a plan view, and an electric wiring part C provided on the external circuit board overlapping the surface A when seen in a plan view. Therefore, it is possible to provide an optical modulator in which a phenomenon of a resonance mode or the like is prevented and of which broadband characteristics are improved.

DESCRIPTION OF EMBODIMENT

Hereinafter, an optical modulator of the present invention will be described in detail using preferable examples.

As illustrated in FIG. 1, the optical modulator according to an aspect of the present invention is an optical modulator 1 in which an optical modulation element 2 is mounted inside housings (10 and 11), in which at least a portion of an electric line is connected to an external circuit board 7 through a flexible printed circuit 6, and which is disposed on the external circuit board. A recess portion that mounts the flexible printed circuit is formed on an outer bottom surface of the housing 10 and at a part where the flexible printed circuit is connected, and means for preventing a resonance mode or the like is provided, as illustrated in FIGS. 3 to 7, such that a resonance mode of a microwave and a millimeter wave or a parallel plate mode is prevented from being generated among a surface A of the recess portion facing the flexible printed circuit, an electric wiring part B provided on the flexible printed circuit overlapping the surface A when seen in a plan view, and an electric wiring part C provided on the external circuit board overlapping the surface A when seen in a plan view.

In the optical modulator of the present invention, as the optical modulation element 2, it is possible to utilize an optical modulation element constituted by forming an optical waveguide and a modulation electrode on a substrate such as a $LiNbO_3$ substrate (LN substrate) having an electro-optic effect. In addition, without being limited thereto, a semiconductor modulation element or the like can also be utilized. Particularly, an optical modulation element applying a high frequency signal of 25 GHz or higher is preferably utilized in the present invention.

In FIG. 1, a lead pin 4 is configured to be electrically connected to the optical modulation element 2 through a relay substrate 3. However, the lead pin 4 can also be electrically connected to the optical modulation element 2 in a direct manner. In addition, the lead pin 4 and the relay substrate can be connected to each other not only using a wire 50 such as gold but also performing solder connection with a signal wiring provided on the relay substrate.

In regard to the lead pin, it is possible to used lead pins respectively corresponding to electrodes such as a signal electrode and a ground electrode. However, as illustrated in FIG. 1, a conductive sleeve (cylindrical electrode) for a ground electrode can be disposed such that the lead pin of the signal electrode is surrounded. Naturally, a space between the lead pin and the sleeve is filled with an insulating material such as glass. When such a combination of the lead pin and the sleeve is employed, the impedance of a part connected with the lead pin can be stably set to a predetermined value.

In the flexible printed circuit 6 used for the optical modulator of the present invention, polyimide is used as a base material (substrate), and an electric line formed on the base material using Au, Cu, and the like. The thickness of an electric wiring as an electrode is 20 μm or greater and is more preferably 25 μm or greater. At least a ground wiring having the same thickness is formed together with the signal electrode on the surface where the signal electrode is formed. Even if the thickness of a ground electrode constituted of a microstrip (MS) line or a ground electrode constituted of a G-CPW line (having a coplanar line formed on one surface and a ground electrode formed on the other surface) is 20 μm or less, the thickness is sufficient to function as a ground electrode. Therefore, it is not essential to form the electrode thick.

The means for preventing a resonance mode or the like according to the present invention will be described in detail. As the means for preventing a resonance mode or the like, the following four methods can be appropriately executed in combination.

(1) Method of adjusting cavity size: The dielectric constant in a space configuring a gap or the distance between reflection surfaces is adjusted in accordance with a band to be used. A shielding reflection surface can be inserted into the gap. This method is less effective for a parallel plate mode.

(2) Unevenness of cavity: An FPC is tilted with respect to an inner surface A of the recess portion or the front surface of the external circuit board. The FPC is warped or is formed in a waveform. An inner wall surface of the recess portion is tilted with respect to the FPC or the front surface of the external circuit board. The inner wall surface is formed in a waveform, a corrugated shape, or a stepped shape.

(3) Addition of function of reflection/absorption: The inner wall surface of the recess portion is roughened. A non-metal material or a high dielectric constant material is disposed in the gap, on the inner wall surface, or on the front surface of the external circuit board.

(4) An electrical short-circuit is caused between surfaces facing each other using a via hole or a blind via hole causing a short-circuit between ground electrode surfaces of the FPC, or using a ball grid, a resistance sponge, or the like causing a short-circuit between a pillar or the ground electrode surface of the PFC and the inner surface A of the recess portion or the external circuit board.

(5) A notch is made in the ground electrode of the FPC, and the area of the ground electrode facing the inner surface A of the recess portion or the external circuit board is reduced.

Next, specific examples will be described using FIGS. 3 to 8.

Figure 3:
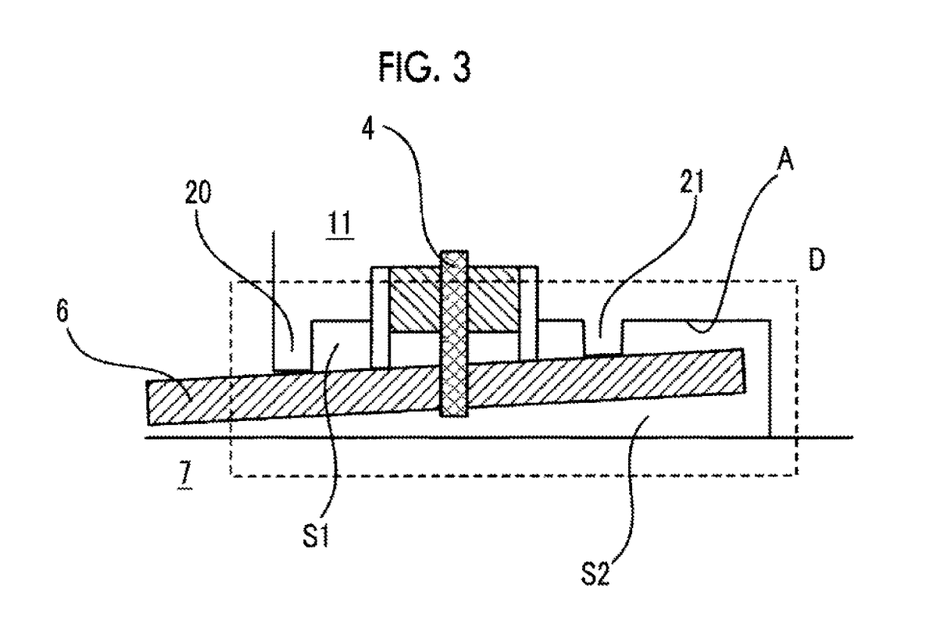
FIG. 3 is a view describing a first example of the optical modulator according to the present invention.

FIG. 3 is a first example in which the FPC 6 is disposed in a tilted manner and cavities (gaps S1 and S2) have uneven shapes. In order to hold the FPC 6 in a tilted manner, projecting support portions (20 and 21) having heights different from each other are provided on the inner surface of the recess portion. Naturally, the number of support portions is not limited to two as illustrated in FIG. 3, and three or more support portions may be formed.

Figure 4:
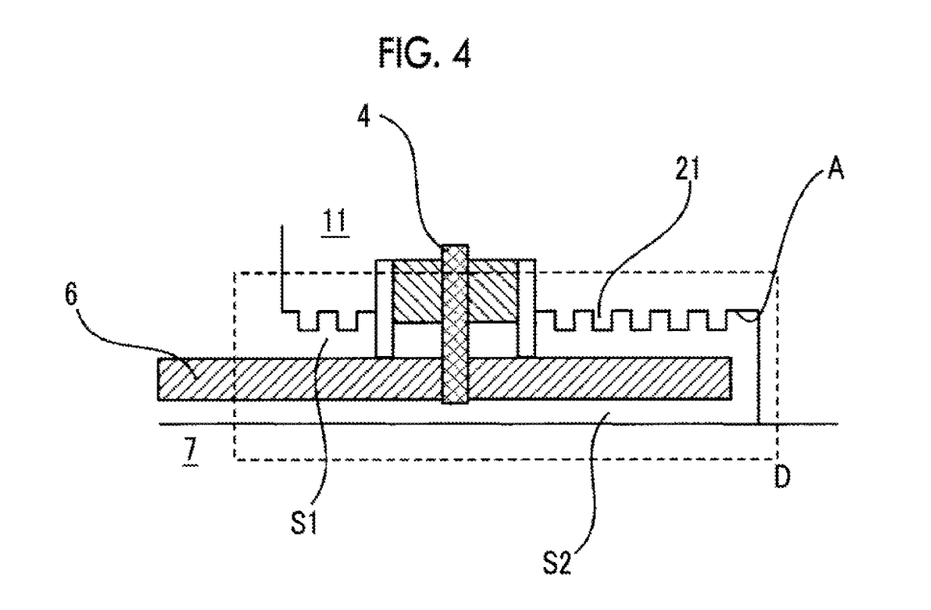
FIG. 4 is a view describing a second example of the optical modulator according to the present invention.

FIG. 4 is a second example in which a corrugated shape is formed on the inner surface A of the recess portion so that the cavity becomes uneven. In addition, the inner wall surface of the recess portion can be configured to be roughened such that generation of a resonance mode is prevented. In FIG. 4, a constantly corrugated shape is formed. However, there is no need to have a constant shape for preventing a resonance mode.

Figure 5:
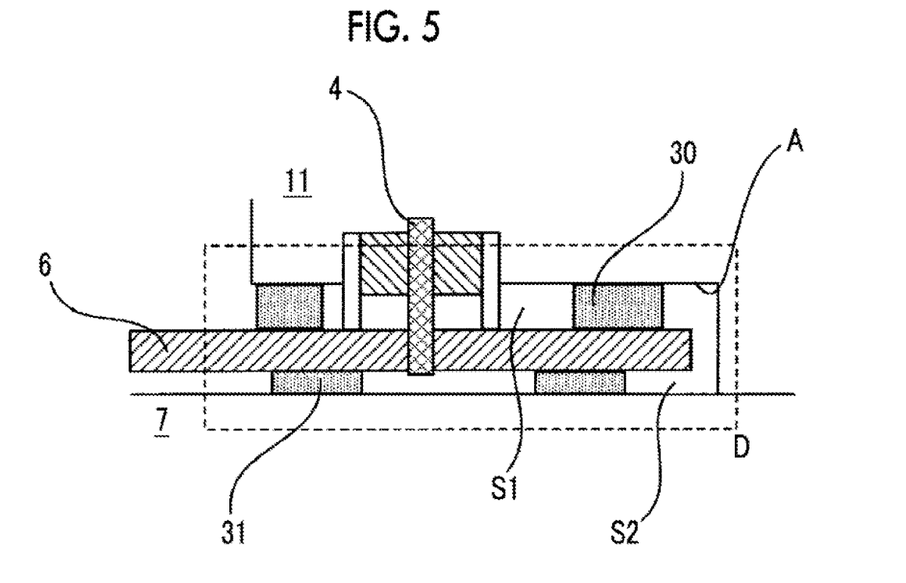
FIG. 5 is a view describing a third example of the optical modulator according to the present invention.

FIG. 5 is a third example in which dielectric constant materials (30 and 31) are partially disposed in the gaps S1 and S2. Accordingly, it is possible to realize not only a change in cavity size but also unevenness of the cavity. As a result, it is possible to prevent generation of not only a resonance mode but also a parallel plate mode.

As illustrated in FIGS. 3 to 5, when at least one of the clearance between the inner surface A of the recess portion and the electric wiring part (wiring disposed on the front surface or the back surface of the FPC) of the FPC 6 or the dielectric constant therebetween, and the clearance between the electric wiring part of the FPC 6 and the electric wiring part (wiring on the front surface of the circuit board) of the external circuit board 7 or the dielectric constant therebetween is set to be locally varied, a resonance mode or the like can be prevented.

Figure 6:
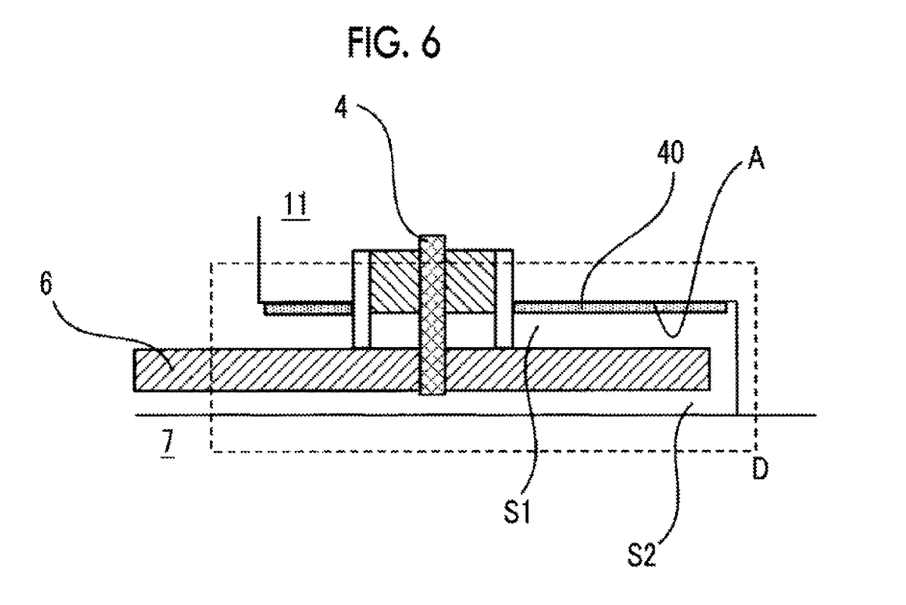
FIG. 6 is a view describing a fourth example of the optical modulator according to the present invention.

FIG. 6 is a fourth example in which materials (a non-metal material and a high dielectric constant material) 40 are disposed on the inner wall surface of the recess portion such that a microwave and a millimeter wave are absorbed and attenuated. Accordingly, generation of a resonance mode or the like is prevented. Naturally, an absorption material or an attenuation material can be disposed at a portion on the front surface (part facing the FPC 6) of the external circuit board 7.

In addition, as a method of preventing a parallel plate mode from being generated between the FPC 6 and the external circuit board 7, it is effective to have a configuration in which no electrode such as a ground electrode is disposed on the front surface of external circuit board 7 facing the FPC 6.

Figure 7:
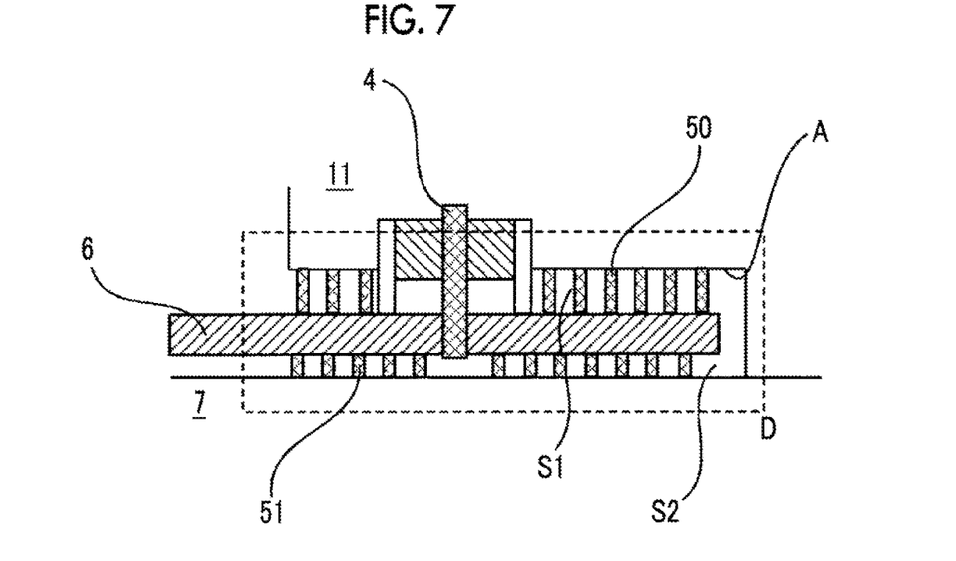
FIG. 7 is a view describing a fifth example of the optical modulator according to the present invention.

FIG. 7 is a fifth example in which the inner surface A of the recess portion and the electric wiring part (particularly, the ground electrode formed on the front surface side of the FPC) of the FPC 6 are electrically connected to each other using the pillar 50 formed of a conductive material such as gold, and a short-circuit is caused between the surfaces. The electric wiring part (particularly, the ground electrode formed on the back surface side of the FPC) of the FPC 6 and the electric wiring part (particularly, the ground electrode formed on the front surface of the circuit board) of the external circuit board can be electrically connected to each other using the pillar 51. In a case where a plurality of signal lines are arranged on the FPC 6, if pillars are formed on both sides of the signal lines along the signal lines, the crosstalk reducing effect is further enhanced.

In a relationship between disposition clearance in a plurality of pillars and a suppressing amount, for example, in a case where the clearance to an adjacent pillar is set to 500 µm for a microwave and a millimeter wave of 75 GHz, it is possible to realize suppression of approximately 10 dB. In a case where the pillar clearance is set to 100 µm, it is possible to realize suppression of approximately 40 dB.

In addition, in a case where the ground electrode (ground wiring) is formed on both surfaces of the FPC 6, a via hole electrically connecting both the ground electrodes with each other can be provided by disposing a conductive material in a hole penetrating the FPC in a region where both the ground electrodes face each other.

Figure 8:
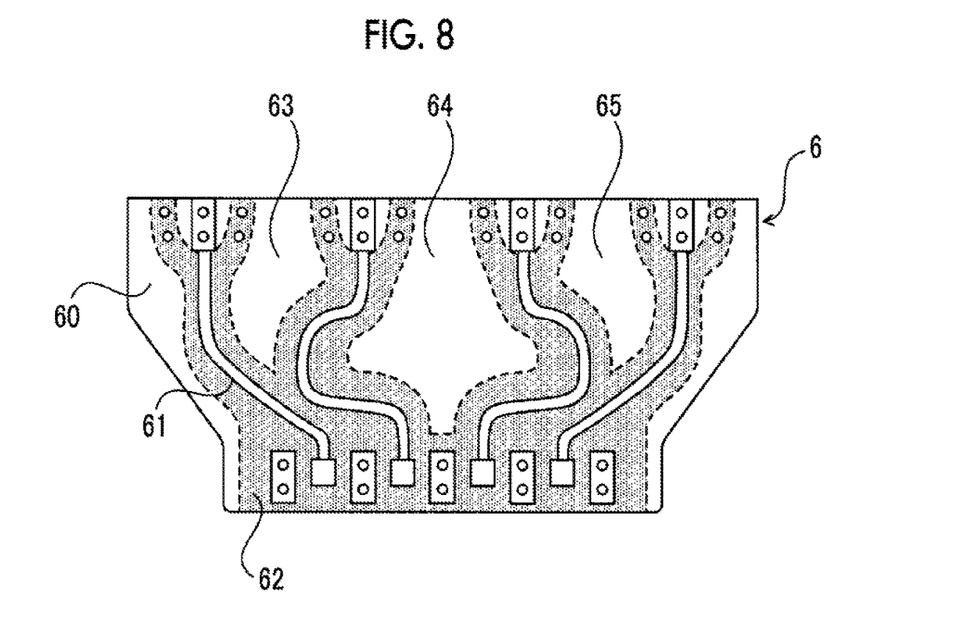
FIG. 8 is a view describing a sixth example of the optical modulator according to the present invention.

FIG. 8 is a sixth example in which notches (63 to 65) are provided in a ground electrode 62 forming the FPC 6, and generation of a parallel plate mode can be prevented by reducing the area of the ground electrode facing the inner surface A of the recess portion or the electric wiring part C of the external circuit board. Crosstalk between the signal electrodes is also greatly reduced. The reference sign 60 in FIG. 8 indicates an insulating substrate of the FPC, the reference sign 61 indicates the signal electrode formed on the front surface (front side in the diagram) of the insulating substrate, and the reference sign 62 indicates the ground electrode formed on the back surface (inner side in the diagram) of the insulating substrate. When the region of the notches (63 to 65) becomes wider, the parallel plate mode preventing effect and the crosstalk reducing effect are enhanced. Moreover, the flexibility of the FPC 6 is improved due to the notch. Therefore, when the FPC 6 is warped and wired, the parallel plate mode preventing effect and the crosstalk reducing effect are further enhanced.

Hereinabove, preferable examples of the present invention have been described with reference to the accompanying drawings. There is no need to mention that present invention is not limited to the examples described above. The shape, the combination, and the like of each constituent members illustrated in the examples described above are examples, and various changes can be made based on the design requirement and the like within the scope not departing from the gist of the present invention. There is no need to mention that the effect can be further enhanced by appropriately combining the described examples.

INDUSTRIAL APPLICABILITY

As described above, according to the present invention, it is possible to provide an optical modulator in which a phenomenon of a resonance mode or the like is prevented from being generated in a recess portion of a housing that mounts a flexible printed circuit and of which the broadband characteristics are improved.

REFERENCE SIGNS LIST

1: OPTICAL MODULATOR
2: OPTICAL MODULATION ELEMENT
3: RELAY SUBSTRATE
4: LEAD PIN
5, 50: WIRE BONDING
6: FLEXIBLE PRINTED CIRCUIT
7: EXTERNAL CIRCUIT BOARD
10: HOUSING
11: HOUSING (LID)

The invention claimed is:

1. An optical modulator in which an optical modulation element is mounted inside a housing, in which at least a portion of an electric line is connected to an external circuit board through a flexible printed circuit, and which is disposed on the external circuit board,
   wherein a recess portion that mounts the flexible printed circuit is formed on an outer bottom surface of the housing and at a part where the flexible printed circuit is connected,
   a plurality of signal lines are disposed in the flexible printed circuit, and means for preventing a resonance mode is provided such that a resonance mode of a microwave and a millimeter wave or a parallel plate mode is prevented from being generated among a surface A of the recess portion facing the flexible printed circuit, an electric wiring part B provided on the flexible printed circuit overlapping the surface A when seen in a plan view, and an electric wiring part C provided on the external circuit board overlapping the surface A when seen in a plan view.

2. The optical modulator according to claim 1,
wherein in the means for preventing a resonance mode or the like, at least one of a clearance or a dielectric constant between the surface A and the electric wiring part B, and a clearance or a dielectric constant between the electric wiring part B and the electric wiring part C is set to be locally varied.

3. The optical modulator according to claim 1,
wherein in the means for preventing a resonance mode, at least any one of a pillar electrically connecting the surface A and the electric wiring part with each other or a pillar electrically connecting the electric wiring part B and the electric wiring part with each other is provided.

4. The optical modulator according to claim 1,
wherein electric wirings are respectively formed on both surfaces of the flexible printed circuit, and a via hole electrically connecting ground wirings on both the surfaces with each other is formed.

5. The optical modulator according to claim 1,
wherein a distance of at least a part between the surface A and the electric wiring part B or between the electric wiring part B and the electric wiring part C is 25 μm or smaller.

* * * * *